(12) United States Patent
Kuwata et al.

(10) Patent No.: US 12,438,071 B2
(45) Date of Patent: Oct. 7, 2025

(54) SEMICONDUCTOR MODULE AND METHOD FOR MANUFACTURING SEMICONDUCTOR MODULE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Kazuki Kuwata, Nisshin (JP); Hiroshi Ishino, Nisshin (JP); Hirokazu Sampei, Nisshin (JP); Masaru Narikawa, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 367 days.

(21) Appl. No.: 18/181,618

(22) Filed: Mar. 10, 2023

(65) Prior Publication Data

US 2023/0411260 A1 Dec. 21, 2023

(30) Foreign Application Priority Data

May 19, 2022 (JP) .................................. 2022-082427

(51) Int. Cl.
*H01L 23/498* (2006.01)
*H01L 21/56* (2006.01)
(Continued)

(52) U.S. Cl.
CPC ...... *H01L 23/49811* (2013.01); *H01L 21/565* (2013.01); *H01L 23/293* (2013.01); *H01L 23/3114* (2013.01); *H01L 23/49838* (2013.01)

(58) Field of Classification Search
CPC ............. H01L 23/49811; H01L 21/565; H01L 23/49517; H01L 23/49555
(Continued)

(56) References Cited

U.S. PATENT DOCUMENTS

2006/0151795 A1\* 7/2006 Yamaguchi ............ H03K 17/08
257/E25.032
2018/0128969 A1 5/2018 Iwaguchi et al.
(Continued)

FOREIGN PATENT DOCUMENTS

JP H04-249329 A 9/1992
JP 2018-041769 A 3/2018
(Continued)

OTHER PUBLICATIONS

U.S. Appl. No. 18/181,679, filed Mar. 10, 2023, Ishino et al.

*Primary Examiner* — Quoc D Hoang
(74) *Attorney, Agent, or Firm* — Posz Law Group, PLC

(57) ABSTRACT

In a semiconductor module, first and second connection terminals and a control terminal are electrically connected to a semiconductor chip. The second connection terminal extends in a first direction in a resin molded part and projects from a predetermined surface of the resin molded part. An internal terminal of the first connection terminal extends in the resin molded part along the first direction and overlaps with the second connection terminal with a predetermined space therebetween in a second direction, and is exposed from an opening portion of the resin molded part. An external terminal of the first connection terminal is connected to the internal terminal at the opening portion and projects outside the resin molded part. The first connection terminal includes a tie bar remaining portion extending from the internal terminal in a direction that intersects the first direction and the second direction.

6 Claims, 12 Drawing Sheets

(51) Int. Cl.
  *H01L 23/29* (2006.01)
  *H01L 23/31* (2006.01)
(58) Field of Classification Search
  USPC .......................................................... 257/734
  See application file for complete search history.

(56) References Cited

U.S. PATENT DOCUMENTS

| | | |
|---|---|---|
| 2019/0295991 A1 | 9/2019 | Takahashi |
| 2019/0318999 A1 | 10/2019 | Kawashima |
| 2021/0407892 A1 | 12/2021 | Ishino et al. |
| 2022/0415765 A1 | 12/2022 | Ishino et al. |

FOREIGN PATENT DOCUMENTS

| | | | |
|---|---|---|---|
| JP | 2018-186184 A | 11/2018 | |
| JP | 2019-193512 A | 10/2019 | |

* cited by examiner

| DISTANCE RATIO (d1/d2) | INVOLVED VOIDS |
|---|---|
| 1.4 | NO |
| 2.0 | NO |
| 2.5 | NO |
| 2.7 | EXIST |
| 3.6 | EXIST |

SEMICONDUCTOR MODULE AND METHOD FOR MANUFACTURING SEMICONDUCTOR MODULE

CROSS REFERENCE TO RELATED APPLICATION

The present application claims the benefit of priority from Japanese Patent Application No. 2022-82427 filed on May 19, 2022. The entire disclosures of the above application are incorporated herein by reference.

TECHNICAL FIELD

The present disclosure relates to a semiconductor module and a method for manufacturing the semiconductor module.

BACKGROUND

There has been known a semiconductor module that has a semiconductor element, first and second connection terminals connected to the semiconductor element, and a resin molded part sealing the semiconductor element and the first and second connection terminals so that the first and second connection terminals are partly exposed from the resin molded part. In the semiconductor module, the first connection terminal and the second connection terminal each have a plate shape, and are arranged to overlap each other in order to reduce wiring inductance.

Such a semiconductor module is manufactured as follows. First, a component member in which the semiconductor element and the first and second connection terminals are connected is prepared. Also, a mold including a first mold part and a second mold part is prepared. In the mold, a cavity is provided by engaging the first mold part and the second mold part. The component member is placed in the cavity of the mold, and a molten resin is injected into the cavity. When the molten resin is solidified, the resin molded part that integrally seals the semiconductor element and the first and second connection terminals is produced. In this way, the semiconductor module is produced.

SUMMARY

The present disclosure describes a semiconductor module, and a method for manufacturing the semiconductor module. According to an aspect of the present disclosure, a semiconductor module may include a semiconductor chip, a resin molded part sealing the semiconductor chip, first and second connection terminals electrically connected to the semiconductor chip; and a control terminal electrically connected to the semiconductor chip. The resin molded part may have a predetermined surface, and an opening portion on a surface different from the predetermined surface. The first connection terminal and the second connection terminal may each have a plate shape. The second connection terminal may extend in a first direction in the resin molded part and project from the predetermined surface of the resin molded part. The first connection terminal may include an internal terminal and an external terminal. The internal terminal may be disposed in the resin molded part along the first direction and overlap with the second connection terminal in a second direction with a predetermined space therebetween. The internal terminal may be exposed from the opening portion. The external terminal may be connected to the internal terminal at the opening portion and project outside the resin molded part. The first connection terminal may include a tie bar remaining portion extending from the internal terminal in a direction that intersects the first direction and the second direction.

BRIEF DESCRIPTION OF THE DRAWINGS

Objects, features and advantages of the present disclosure will become more apparent from the following detailed description made with reference to the accompanying drawings, in which like parts are designated by like reference numbers and in which.

DETAILED DESCRIPTION

Figure 1:
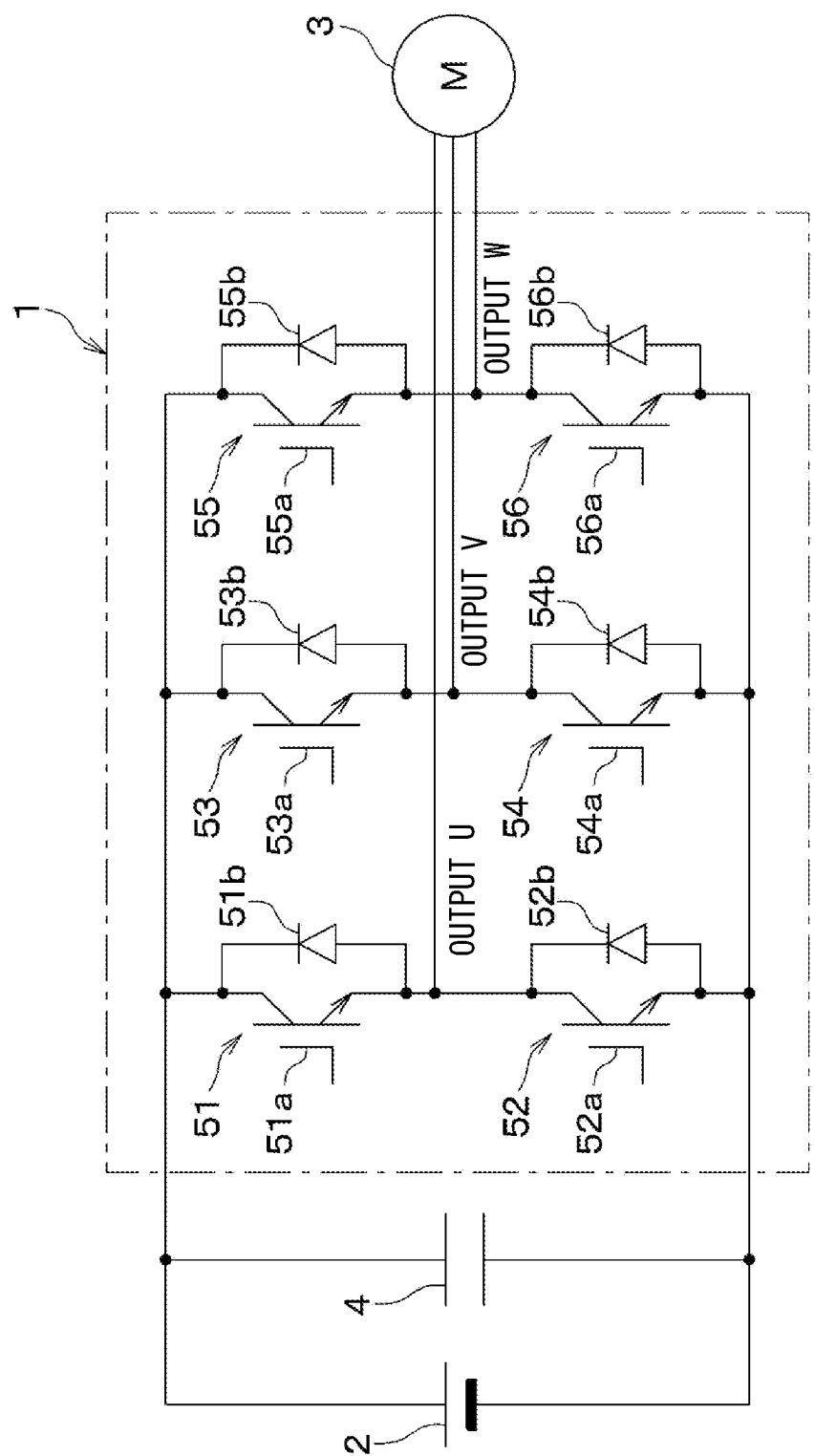
FIG. 1 is a circuit diagram of a three-phase inverter circuit including a semiconductor module according to a first embodiment of the present disclosure.

In a semiconductor module in which a first connection terminal and a second connection terminal are arranged to overlap each other and disposed in a resin molded part, when forming the resin molded part by using a mold, it is difficult to hold the first connection terminal and the second connection terminal between a first mold part and a second mold part. As a result, the distance between the first connection terminal and the second connection terminal may be varied in the semiconductor modules.

The present disclosure provides a semiconductor module and a method for manufacturing the semiconductor module, which are capable of suppressing variation in a distance between a first connection terminal and a second connection terminal.

According to an aspect of the present disclosure, a semiconductor module includes a semiconductor chip, a resin molded part that seals the semiconductor chip, a first connection terminal that is electrically connected to the semiconductor chip, a second connection terminal that is electrically connected to the semiconductor chip, and a control terminal that is electrically connected to the semiconductor chip. The first connection terminal and the second connection terminal extend in a first direction and project outside the resin molded part. The first connection terminal and the second connection terminal each have a plate shape, and are arranged to overlap each other in a second direction with a predetermined space therebetween. The resin molded part has a predetermined surface, and an opening portion on a surface different from the predetermined surface. The second connection terminal projects from the predetermined surface of the resin molded part. The first connection terminal includes an internal terminal that is disposed in the resin molded part and exposed from the opening portion, and an external terminal that is connected to the internal terminal at the opening portion and projects outside the resin molded part. The first connection terminal includes a tie bar remaining portion extending from the internal terminal in a direction that intersects the first direction and the second direction.

In the semiconductor module according to the aspect described above, the first connection terminal has the tie bar remaining portion that extends from the internal terminal and projects outside the resin molded part. Therefore, when forming the resin molded part, the second connection terminal can be held between the first mold part and the second mold part as well as the tie bar, which provides the tie bar remaining portion, can be held between the first mold part and the second mold part. Accordingly, it is possible to suppress a change in the distance between the internal terminal of the first connection terminal and the second connection terminal.

According to an aspect of the present disclosure, a method for manufacturing the semiconductor module includes: preparing a terminal constituent member in which the internal terminal and the control terminal are integrated through a tie bar; forming a component member by electrically connecting the second connection terminal to the semiconductor chip so that the second connection terminal are arranged to overlap with the internal terminal and by electrically connecting the internal terminal and the control terminal to the semiconductor chip; placing the component member in a cavity of a mold, which includes a first mold part and a second mold part providing the cavity therebetween; forming the resin molded part by injecting a molten resin to the mold and solidifying the molten resin; and cutting the tie bar so that the tie bar remaining portion extending from the internal terminal and projecting from the resin molded part is provided. In the placing of the component member, the component member is placed so that the second connection terminal is held between the first mold part and the second mold part, and the tie bar is held between the first mold part and the second mold part.

Therefore, when forming the resin molded part, the second connection terminal can be held between the first mold part and the second mold part as well as the tie bar, which provides the tie bar remaining portion, can be held between the first mold part and the second mold part. Accordingly, it is possible to suppress a change in the distance between the internal terminal of the first connection terminal and the second connection terminal.

Hereinbelow, embodiments of the present disclosure will be described with reference to the drawings. In the following descriptions, the same or equivalent parts are denoted by the same reference numerals throughout the embodiments.

First Embodiment

The following describes a first embodiment with reference to the drawings. In the present embodiment, a semiconductor module that constitutes a three-phase inverter circuit for driving a three-phase alternate current (AC) motor will be described.

First, the three-phase inverter circuit will be described with reference to FIG. 1. A three-phase inverter circuit 1 is for driving a three-phase AC motor as a load 3 based on a direct current (DC) power supply 2. A smoothing capacitor 4 is connected in parallel with the three-phase inverter circuit 1 of the present embodiment, so that a constant power supply voltage can be produced by reducing ripple during switching and suppressing the influence of noise.

The three-phase inverter circuit 1 has a configuration in which series-connected upper and lower arms 51 to 56 are connected in parallel for three phases. In the three-phase inverter circuit 1, intermediate potentials between the upper arms 51, 53, 55 and the lower arms 52, 54, 56 are orderly and alternately applied to the U-phase, V-phase, and W-phase of the three-phase AC motor as the load 3.

Specifically, the upper and lower arms 51 to 56 respectively include semiconductor switching elements 51a to 56a such as insulated gate bipolar transistors (IGBTs) or metal oxide field effect transistors (MOSFETs), and rectifying elements 51b to 56b such as freewheeling diodes (FWDs) for reverse currents. In the three-phase inverter circuit 1, the semiconductor switching elements 51a to 56a of the upper and lower arms 51 to 56 of each phase are controlled to turn on and off, thereby supplying three-phase alternating currents with different cycles to the load 3.

In the present embodiment, the semiconductor chips on which the semiconductor switching elements 51a to 56a and the rectifying elements 51b to 56b for constituting the three-phase inverter circuit 1 are formed are integrated into a semiconductor module. In other words, the three-phase inverter circuit 1 is provided by the semiconductor module with a 6-in-1 structure in which six arms are integrated.

The detailed structure of a semiconductor module 6 of the present embodiment will be described hereinafter with reference to FIGS. 2 to 8. The semiconductor module 6 of the present embodiment includes semiconductor chips 10, first and second lead frames 11 and 12, output terminals 13, control terminals 14, first and second connection terminals 15 and 16, and first and second heat radiation plates 17 and 18. The semiconductor module 6 also includes a resin molded part 19 that integrally encapsulates these constituent elements.

Figure 2:
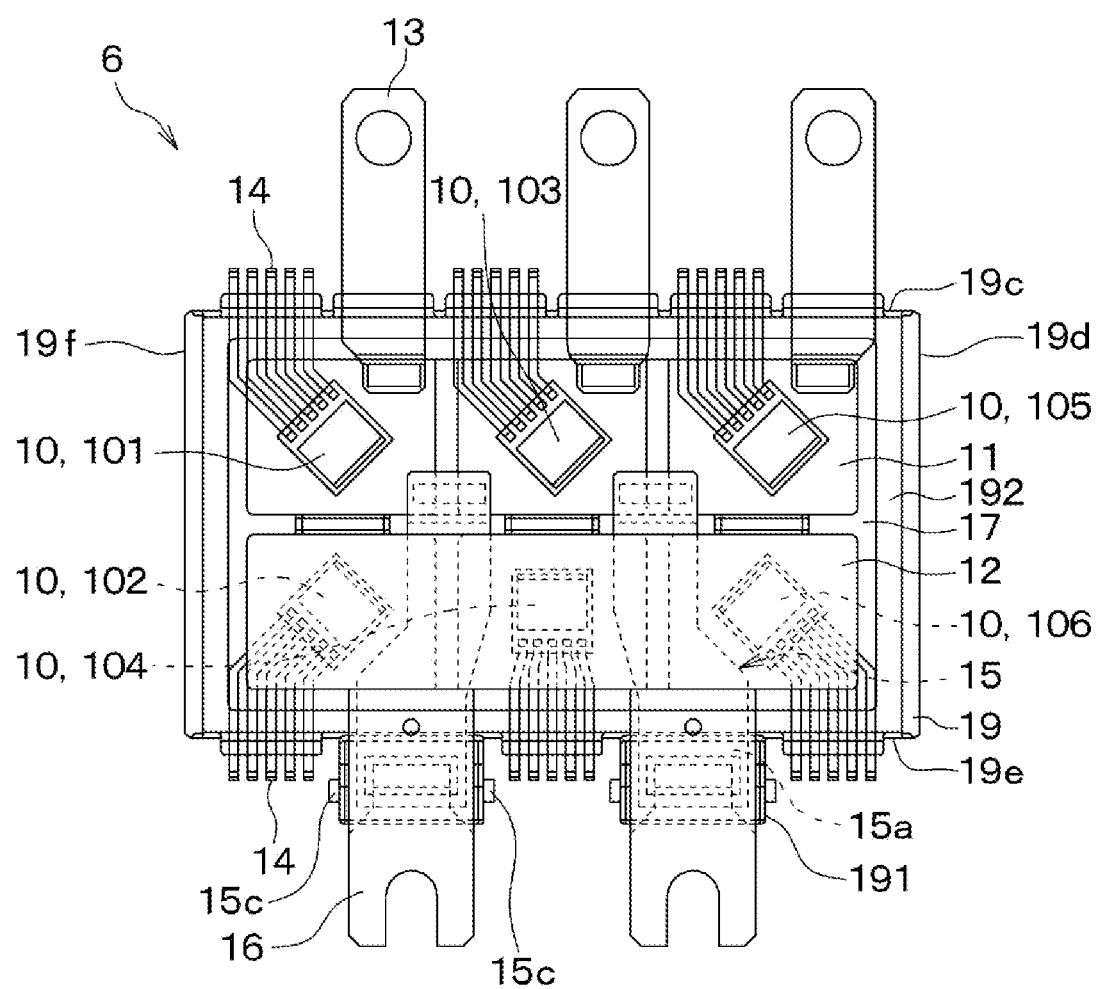
FIG. 2 is a diagram showing an internal structure of the semiconductor module.
Figure 3:
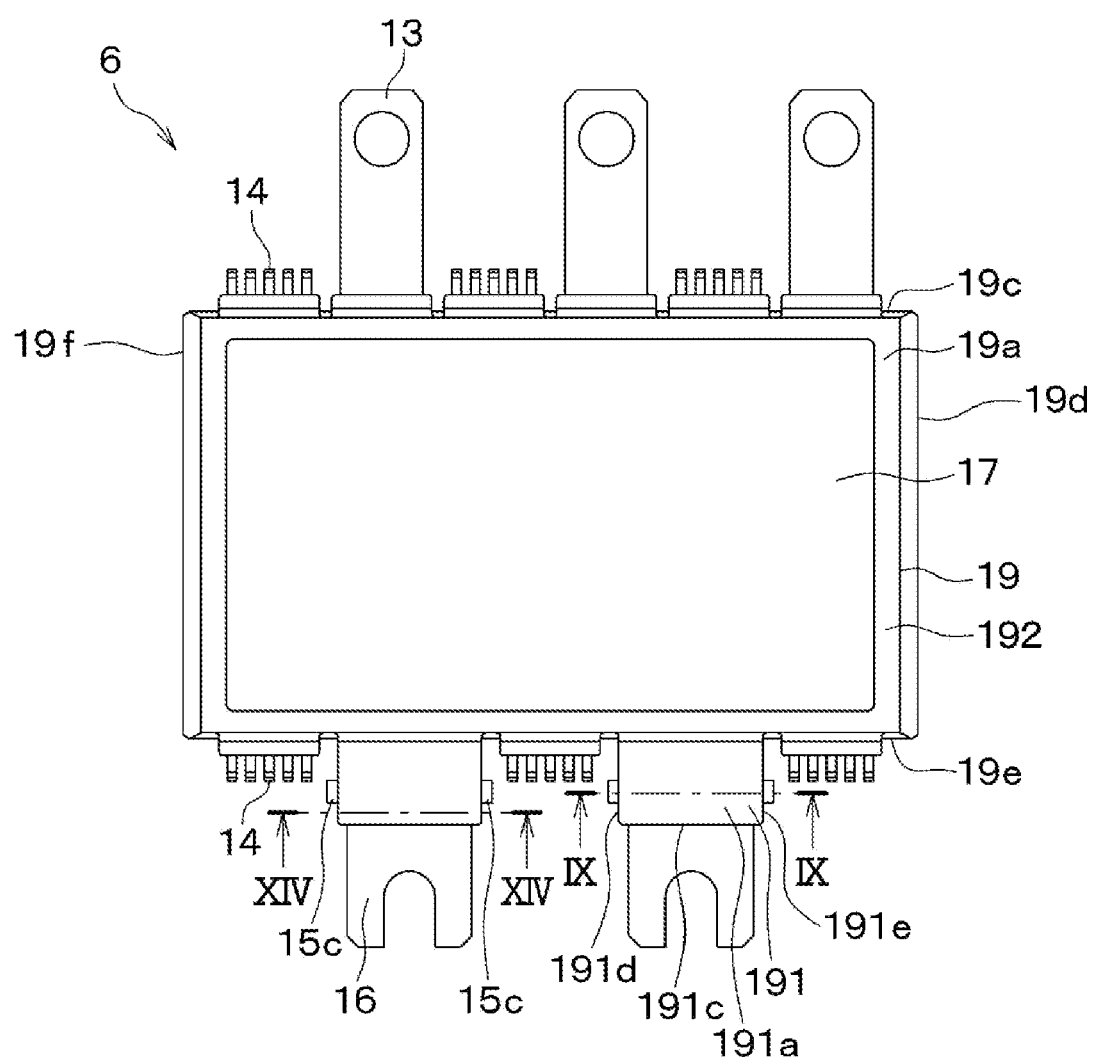
FIG. 3 is a diagram showing a plan view of the semiconductor module viewed from a first surface side of a resin molded part.
Figure 4:
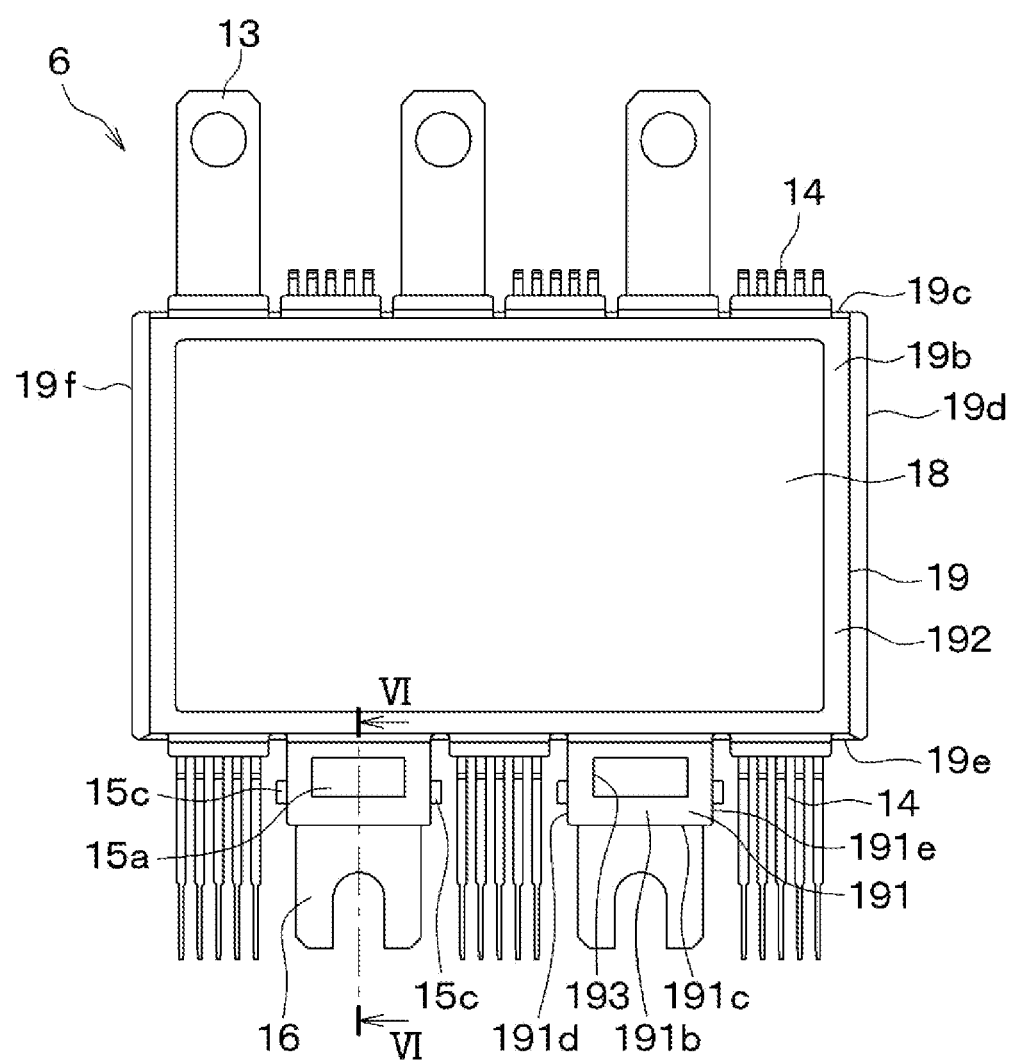
FIG. 4 is a diagram showing a plan view of the semiconductor module viewed from a second surface side of the resin molded part, in a state before an external terminal is connected.
Figure 5:
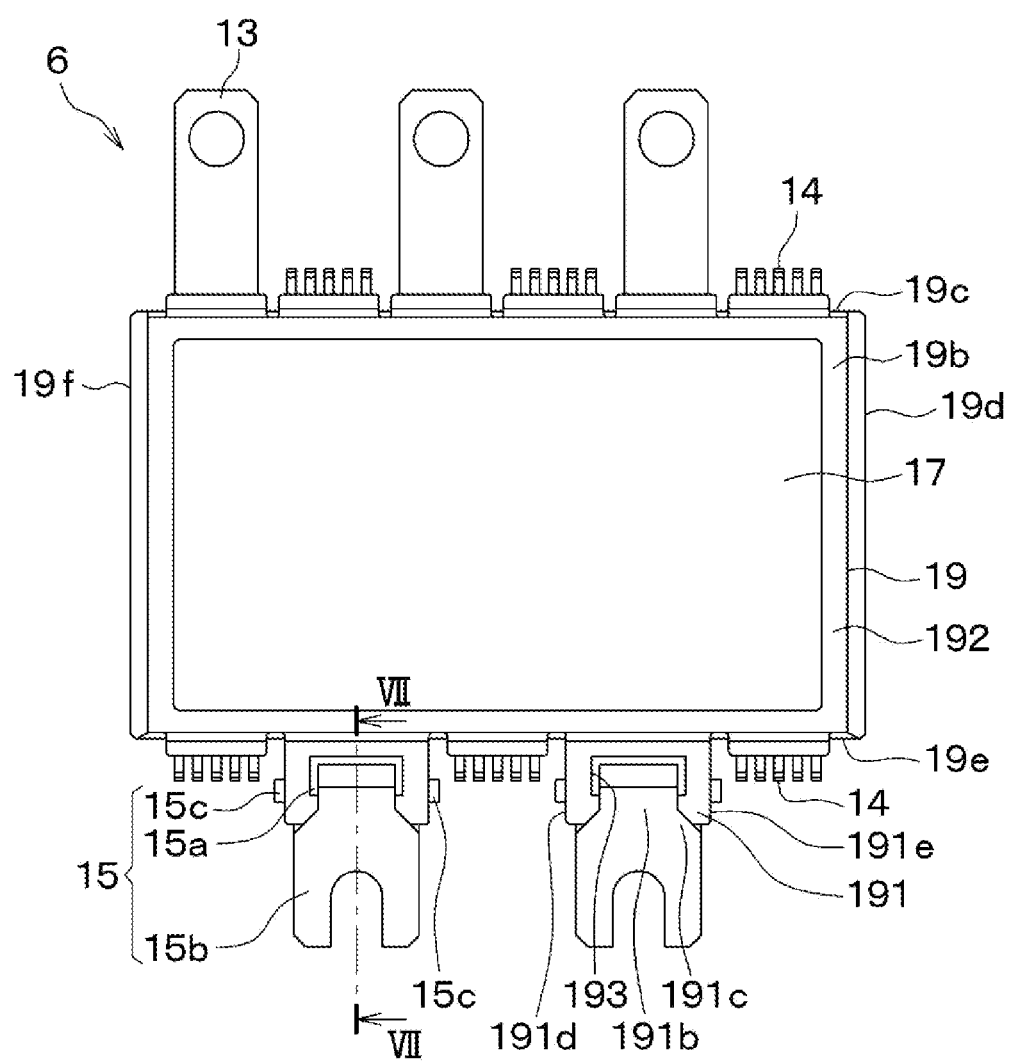
FIG. 5 is a diagram showing a plan view of the semiconductor module viewed from the second surface side of the resin molded part, in a state after the external terminal is connected.

The resin molded part 19 has a substantially rectangular parallelepiped shape with a substantially rectangular planar shape. The resin molded part 19 has a first surface 19a and a second surface 19b opposite to the first surface 19a. The resin molded part 19 also has first through fourth side surfaces 19c through 19f connecting the first surface 19a and the second surface 19b. For example, in the resin molded part 19 shown in FIG. 2, side surfaces extending in the left and right direction of FIG. 2 and facing in the up and down direction in FIG. 2 are referred to as the first side surface 19c and the third side surface 19e. Also, side surfaces extending in the up and down direction in FIG. 2 and facing in the left and right direction in FIG. 2 are referred to as the second side surface 19d and the fourth side surface 19f. In the present embodiment, the third side surface 19e is formed with protrusions 191 that protrude in a direction normal to the third side surface 19e. In addition, although the protrusions 191 will be specifically described later, the protrusions 191 are formed at positions where the first and second connection terminals 15 and 16 are arranged. Further, in the present embodiment, a portion of the resin molded part 19 encapsulating the first and second lead frames 11 and 12 and the like is referred to as a body portion 192. The protrusions 191 have a thickness smaller than the thickness of the body portion 192.

Six semiconductor chips 10 are provided correspondingly to the upper and lower arms 51 to 56. The semiconductor chips 10 constituting the upper and lower arms 51 to 56 are hereinafter referred to as semiconductor chips 101 to 106, respectively.

As shown in FIG. 2, the six semiconductor chips 10 are arranged in three rows. Specifically, the semiconductor chips 101, 103 and 105 constituting the upper arms 51, 53 and 55 are aligned in the order of the semiconductor chips 101, 103 and 105 along one direction parallel to the first surface 19a of the resin molded part 19. The direction along which the semiconductor chips 101, 103 and 105 are aligned will be referred to as an alignment direction. The semiconductor chips 102, 104 and 106 constituting the lower arms 52, 54 and 56 are aligned in the order of the semiconductor chips 102, 104 and 106 along the alignment of the semiconductor chips 101, 103 and 105.

The first and second lead frames 11 and 12 are each made of a conductive material such as copper or iron. The first and second lead frames 11 and 12 each have a substantially rectangular mounting portion. In a plan view, that is, in a view in a thickness direction of the semiconductor module 6, the first lead frame 11 is arranged adjacent to the first side surface 19c, and the second lead frame 12 is arranged adjacent to the third side surface 19e.

The semiconductor chips 101, 103 and 105 of the upper arms 51, 53 and 55 are mounted on a front surface side of the first lead frame 11, and the semiconductor chips 102, 104 and 106 of the lower arms 52, 54 and 56 are mounted on a back surface side of the second lead frame 12. The front surface of the first lead frame 11 is a surface adjacent to the first surface 19a of the resin molded part 19. The back surface of the second lead frame 12 is a surface adjacent to the second surface 19b of the resin molded part 19.

The semiconductor chips 101, 103 and 105 are connected to the output terminals 13 via the first lead frame 11. The semiconductor chips 102, 104 and 106 are connected to the output terminals 13 via the second lead frame 12, wiring layers (not shown), and the first lead frame 11.

The semiconductor module 6 has three output terminals 13. The three output terminals 13 are connected to the U-phase, V-phase, and W-phase of the load 3, respectively. In the present embodiment, the output terminal 13 is made of a plate-shaped conductive member and projects from the first side surface 19c of the resin molded part 19.

Each of the semiconductor chips 101 to 106 is connected to the control terminals 14. The control terminals 14 are connected to a gate electrode or the like formed on a corresponding one of the semiconductor chips 101 to 106. The control terminal 14 is made of a rod-shaped conductive member, and has one end connected to the corresponding one of the semiconductor chips 101 to 106 and the other end projecting from the first side surface 19c or the third side surface 19e of the resin molded part 19. A portion of the control terminal 14 exposed from the resin molded part 19 is bent toward the first surface 19a of the resin molded part 19 so as to project from the first surface 19a in a thickness direction of the resin molded part 19. The thickness direction of the resin molded part 19 corresponds to a left and right direction in FIG. 8.

Specifically, the control terminals 14 are provided for each of the semiconductor chips 101 to 106. The control terminals 14 connected to the semiconductor chips 101, 103 and 105 of the upper arms 51, 53 and 55 project from the first side surface 19c of the resin molded part 19 on the same side as the output terminals 13. The control terminals 14 connected to the semiconductor chips 102, 104 and 106 of the lower arms 52, 54 and 56 project from the third side surface 19e of the resin molded part 19 on the side opposite to the output terminals 13.

Figure 6:
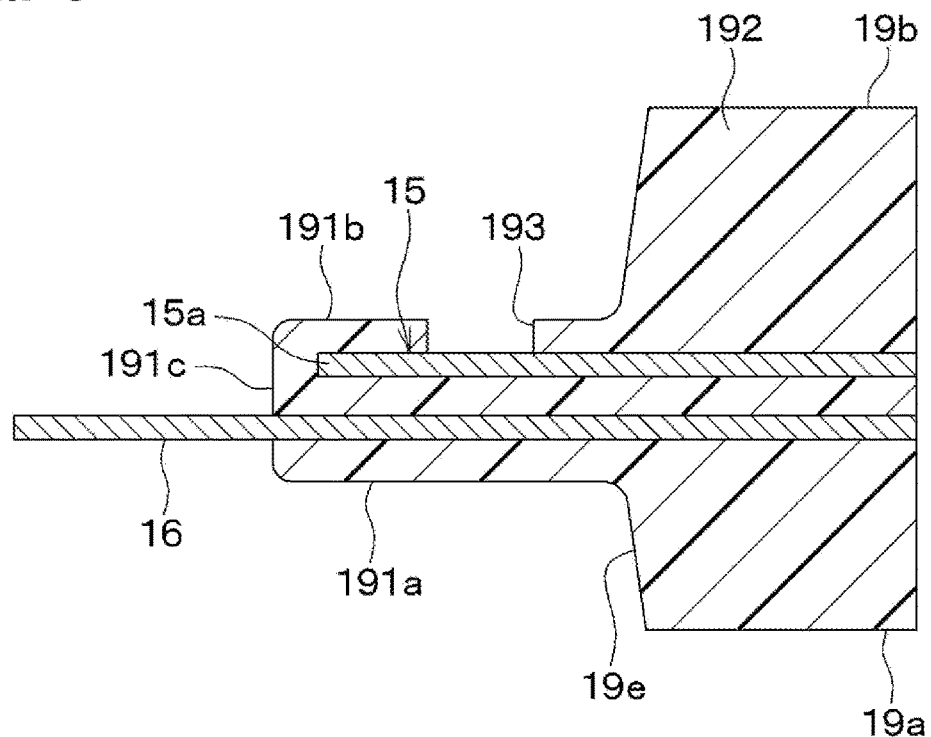
FIG. 6 is a diagram showing a cross-sectional view taken along a line VI-VI in FIG. 4.
Figure 7:
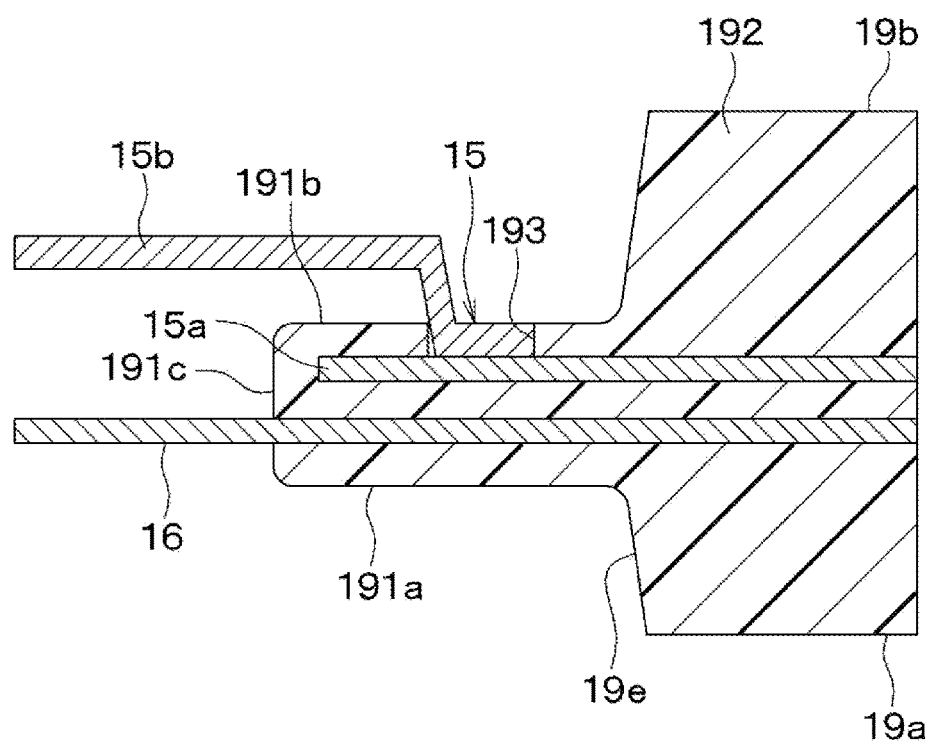
FIG. 7 is a diagram showing a cross-sectional view taken along a line VII-VII in FIG. 5.
Figure 8:
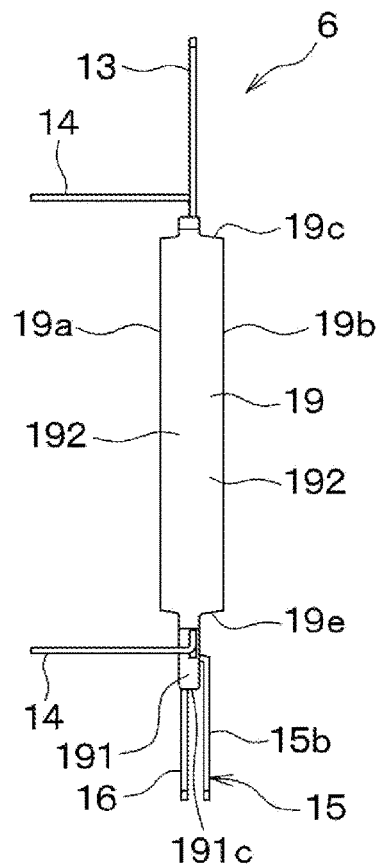
FIG. 8 is a diagram showing a side view of the semiconductor module.
Figure 9:
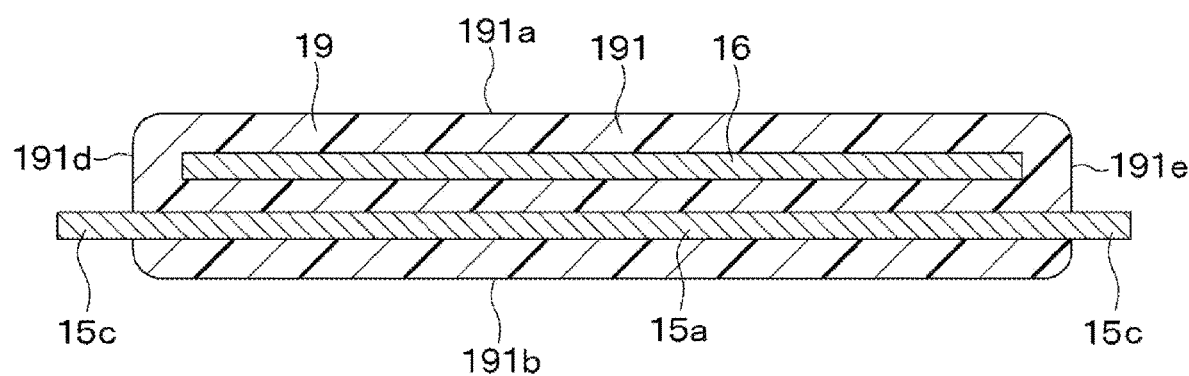
FIG. 9 is a diagram showing a cross-sectional view taken along a line IX-IX in FIG. 3.

The first and second connection terminals 15 and 16 are provided to connect the semiconductor chips 10 to the smoothing capacitor 4. The first and second connection terminals 15 and 16 each have a plate shape. As shown in FIGS. 6 to 8, the first and second connection terminals 15 and 16 are arranged to overlap each other in the thickness direction of the resin molded part 19 and projected from the third side surface 19e of the resin molded part 19 in the overlapped state. That is, the first and second connection terminals 15 and 16 project from the third side surface 19e, that is, on the same side as the control terminals 14 connected to the semiconductor chips 102, 104 and 106 of the lower arms 52, 54 and 56, project. The protrusion 191 of the resin molded part 19 has a first protrusion surface 191a on a side adjacent to the first surface 19a of the body portion 192, and a second protrusion surface 191b on a side adjacent to the second surface 19b of the body portion 192. The protrusion 191 further has a tip surface 191c at an end opposite to the body portion 192. The protrusion 191 further has a first protrusion side surface 191d and a second protrusion side surface 191e that connect to the tip surface 191c. The tip surface 191c can also be regarded as an end surface positioned on the tip side of the protrusion 191 in a protruding direction of the protrusion 191. In the present embodiment, within the protrusion 191, the first connection terminal 15 and the second connection terminal 16 are disposed in the overlapped state so that the first connection terminal 15 is located adjacent to the first protrusion surface 191a and the second connection terminal 16 is located adjacent to the second protrusion surface 191b.

The first and second connection terminals 15 and 16 are layered with a predetermined distance therebetween, and are electrically insulated by interposing a portion of the resin molded part 19 therebetween. Also, the first and second connection terminals 15 and 16 are each arranged at a predetermined distance from the control terminals 14 connected to the semiconductor chips 102, 104 and 106 of the lower arms 52, 54 and 56, respectively. For example, the distance between the control terminals 14 and the first and second connection terminals 15 and 16 is designed to be longer than a distance that ensures insulation between the control terminals 14 and the first and second connection terminals 15 and 16 when a predetermined impulse voltage is applied. In the present embodiment, the direction along which the first and second connection terminals 15 and 16 will also be referred to as a first direction, and the overlapping direction of the first and second connection terminals 15 and 16 will also be referred to as a second direction.

The first connection terminal 15 is a terminal that connects the semiconductor chips 101, 103 and 105 to the positive terminal of the DC power supply 2 via the smoothing capacitor 4. The second connection terminal 16 is a terminal that connects the semiconductor chips 102, 104 and 106 to the negative electrode of the DC power supply 2 via the smoothing capacitor 4.

The first connection terminal 15 of the present embodiment has an internal terminal 15a sealed in the resin molded part 19 and an external terminal 15b disposed outside the resin molded part 19. The internal terminal 15a is made of a plate-shaped conductive member and connected to the semiconductor chips 101, 103 and 105 of the upper arms 51, 53 and 55 via the first lead frame 11.

The semiconductor module 6 of the present embodiment has two first connection terminals 15. The two first connection terminals 15 are arranged so as to interpose the semiconductor chips 103 and 104, which are arranged in the central row of the three rows of the six semiconductor chips 10. Specifically, the internal terminal 15a of one of the two first connection terminals 15 is arranged to pass between the semiconductor chips 101 and 103 and between the semiconductor chips 102 and 104. The internal terminal 15a of the other of the two first connection terminals 15 is arranged to pass between the semiconductor chips 103 and 105 and between the semiconductor chips 104 and 106.

The internal terminal 15a is connected to the semiconductor chips 101, 103 and 105 via the first lead frame 11 at one end in the longitudinal direction, and is covered with the protrusion 191 at the other end. The internal terminal 15a is exposed through an opening portion 193 that is formed on the second protrusion surface 191b of the protrusion 191.

The external terminal 15b is made of a plate-shaped conductive member, and is bent in a substantially crank shape when viewed from the side. The external terminal 15b has two ends on opposite sides of the bent. A first end of the external terminal 15b is connected to the internal terminal 15a that is exposed from the opening portion 193 such as by ultrasonic bonding or brazing. A second end of the external terminal 15b projects along the second protrusion surface 191b of the protrusion 191 while being separated from the second protrusion surface 191b. Although not particularly limited, the distance between the portion of the external terminal 15b including the second end and the protrusion 191 is, for example, 0.1 mm or more and 2 mm or less in order to restrict foreign matter from being caught therebetween. This projected portion of the external terminal 15b is connected to the smoothing capacitor 4.

In addition, the first connection terminal 15 of the present embodiment has tie bar remaining portions 15c that project from the first and second protrusion side surfaces 191d and 191e of the protrusion 191. The tie bar remaining portion 15c is a portion left after cutting a tie bar 210 connecting the internal terminal 15a and the control terminal 14, as will be described later. In the present embodiment, the first connection terminal 15 has two tie bar remaining portions 15c on opposite sides of the internal terminal 15a. The tie bar remaining portions 15c are connected to the internal terminal 15a, respectively. The tie bar remaining portions 15c extend in a direction intersecting the extending direction of the internal terminal 15a and project from the first and second protrusion side surfaces 191d and 191e. In other words, the tie bar remaining portions 15c each extend in a direction intersecting the overlapping direction of the internal terminal 15a and the second connection terminal 16 and the protruding direction of the protrusion 191, and project from the first and second protrusion side surfaces 191d and 191e. The internal terminals 15a and the control terminals 14 are connected to each other through the tie bars 210 in a state before the semiconductor module 6 is produced, as will be described later. Therefore, the control terminals 14, the internal terminals 15a, and the tie bar remaining portions 15c are positioned on the same plane.

The second connection terminal 16 is made of a plate-shaped conductive member, and is connected to the semiconductor chips 102, 104, 106 of the lower arms 52, 54, 56 via the second lead frame 12. The second connection terminal 16 is connected to the semiconductor chips 102, 104, and 106 via the second lead frame 12 at one end in the longitudinal direction, and the other end of the second connection terminal 16 extends from the third side surface 19e of the resin molded part 19 in the same direction as the projecting direction of the external terminal 15b. Specifically, the second connection terminal 16 is arranged so as to project from the tip surface 191c of the protrusion 191 provided on the third side surface 19e. In the present embodiment, the tip surface 191c corresponds to a predetermined surface of the resin molded part 19.

The semiconductor module 6 has two second connection terminals 16. Moreover, as described above, the semiconductor module 6 has two first connection terminals 15. The first connection terminal 15 and the second connection terminal 16 are arranged in layers. In other words, the first connection terminal 15 and the second connection terminal 16 are arranged to overlap with each other in the thickness direction.

Further, in the present embodiment, the creepage distance along the resin molded part 19 between the portion of the tie bar remaining portion 15c projecting from the protrusion 191 and the second connection terminal 16 in the plan view is adjusted so as to maintain the dielectric strength. Although not particularly limited, the creepage distance is set to 4 mm or more in the present embodiment. In other words, the arrangement position of the tie bar remaining portion 15c is adjusted such that the creepage distance along the resin molded part 19 between the tie bar remaining portion 15c and the second connection terminal 16 is a desired distance so as to maintain insulation resistance in the plan view.

The external terminal 15b has the same planar shape as the second connection terminal 16 with respect to the overlapping direction, that is, when viewed in the direction normal to the surface of the external terminal 15b. In the present embodiment, tips of the portions of the external terminal 15b and the second connection terminal 16 projecting from the protrusion 191 each have a shape corresponding to a fastening member such as a bolt so as to be connected to the smoothing capacitor 4. Specifically, the tips of the portions of the external terminal 15b and the second connection terminal 16 projecting from the protrusion 191 is each divided into two sections to be approximately a U-shaped portion. The U-shaped portion of the external terminal 15b and the U-shaped portion of the second connection terminal 16 have the same or substantially the same shape. The projection length of the external terminal 15b and the projection length of the second connection terminal 16 are the same or substantially the same in the projection direction of the external terminal 15b and the second connection terminal 16.

The first and second heat radiation plates 17 and 18 correspond to heat sinks and each have a surface facing the semiconductor chip 10. The semiconductor chips 101 to 106 are connected to the first and second heat radiation plates 17 and 18 via the first and second lead frames 11 and 12, respectively. The first and second heat radiation plates 17 and 18 each have a surface exposed from the resin molded part 19 on the side opposite to the first and second lead frames 11 and 12. As described above, the semiconductor chips 101 to 106 are disposed between the first and second heat radiation plates 17 and 18. The semiconductor module 6 is used to drive the load 3 in a state where the semiconductor module 6 is interposed on both sides in the thickness direction by cooling equipment (not shown) to ensure heat dissipation.

The semiconductor module 6 of the present embodiment has the configurations as described above. Although not described in detail, the semiconductor module 6 is used in the state in which the first and second connection terminals 15 and 16 are connected to the smoothing capacitor 4, and the output terminals 13 are connected to the load 3.

Figure 10:
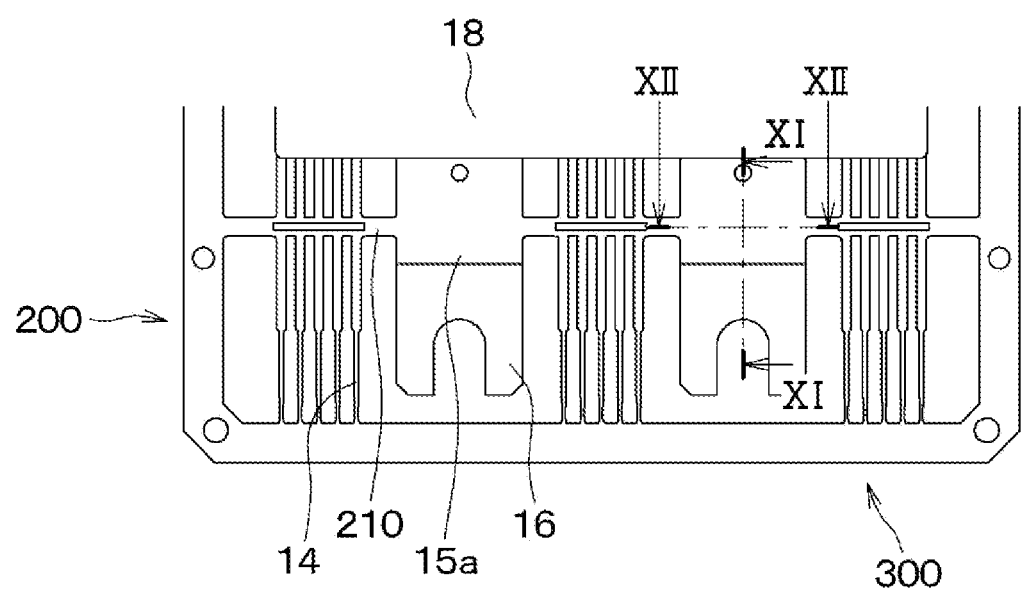
FIG. 10 is a diagram showing a process of manufacturing the semiconductor module.

Next, a method for manufacturing the semiconductor module 6 will be described with reference to FIGS. 10 to 13. FIGS. 10 and 13 are plan views on the first connection terminal 15 side.

First, the semiconductor chips 101 to 106 are mounted on the first and second lead frames 11 and 12. Then, the output terminals 13 and the second connection terminals 16 are electrically connected to the semiconductor chips 101 to 106. Further, as shown in FIG. 10, a terminal constituent member 200 in which the internal terminals 15a of the first connection terminals 15 and the control terminals 14 are integrally connected through the tie bars 210 is prepared. Then, the internal terminals 15a and the control terminals 14 are electrically connected to the respective semiconductor chips 101 to 106. Further, the first and second heat radiation plates 17 and 18 are arranged. In this way, a component member 300 in which the internal terminals 15a and the second connection terminals 16 are connected to the semiconductor chips 101 to 106 is prepared.

Figure 11:
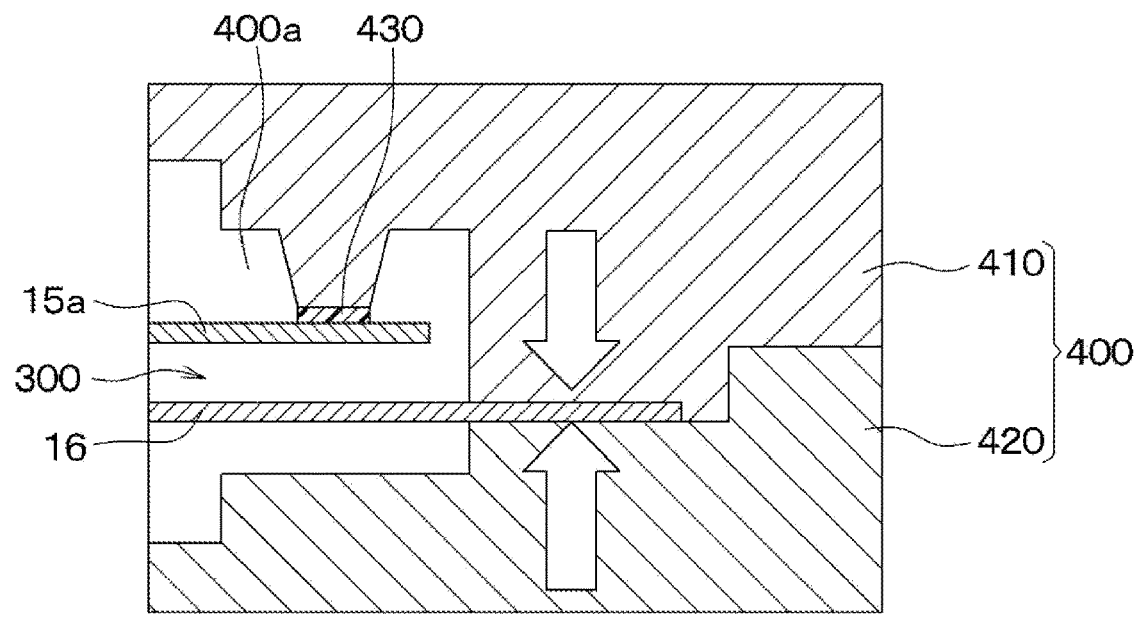
FIG. 11 is a diagram showing a cross-sectional view of a component member placed in a mold.
Figure 12:
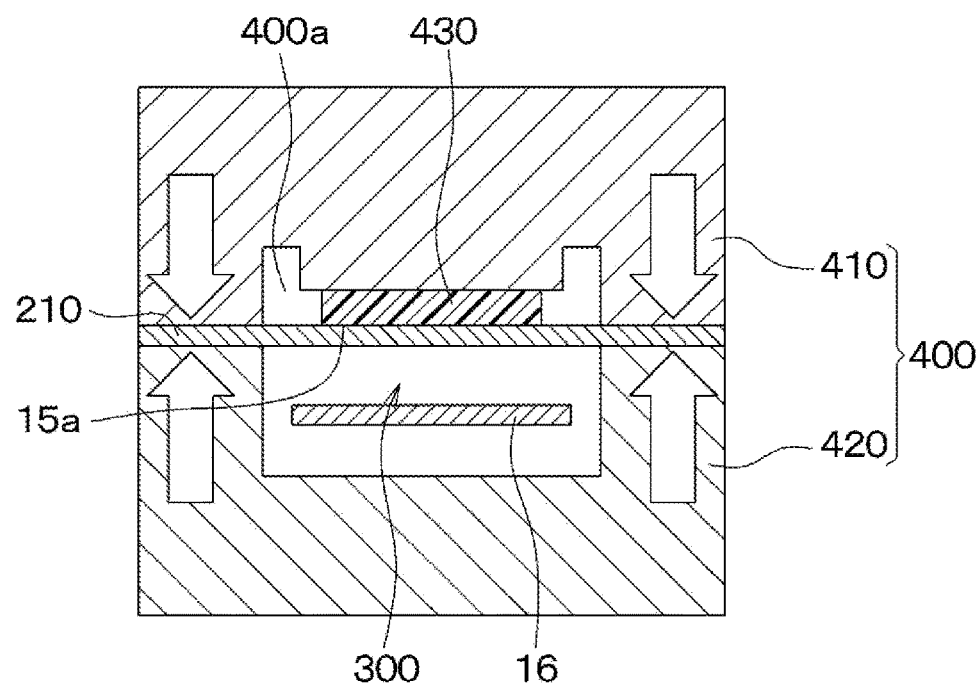
FIG. 12 is a diagram showing a cross-sectional view of the component member placed in a mold.
Figure 13:
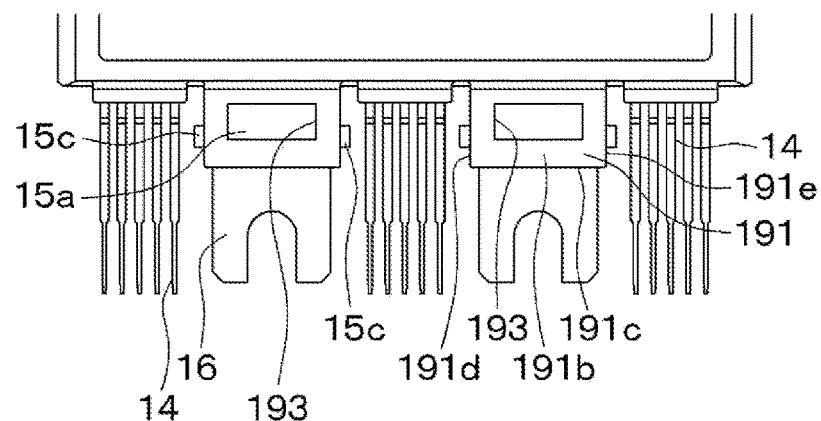
FIG. 13 is a diagram showing a plan view of a part of the component member after the resin molded part is formed in the process of manufacturing the semiconductor module.

Subsequently, as shown in FIGS. 11 and 12, the component member 300 is placed in a cavity 400a of a mold 400. The mold 400 includes a first mold part 410 and a second mold part 420 that are engaged to form the cavity 400a therein. Specifically, as shown in FIG. 11, the component member 300 is placed so that the portions of the second connection terminals 16 exposing from the protrusion 191 of the resin molded part 19 are held between the first mold part 410 and the second mold part 420. Further, as shown in FIG. 12, the component member 300 is placed so that the tie bars 210 of the component member 300 and the portions of the control terminals 14 to be exposed from the resin molded part 19 are held between the first mold part 410 and the second mold part 420. That is, since the internal terminals 15a are connected to the tie bars 210, the component member 300 is placed so that the internal terminals 15a are fixed at predetermined positions within the mold 400. In the present embodiment, in this way, different portions of the component member 300 are held between the first mold part 410 and the second mold part 420 in the overlapping direction of the internal terminal 15a and the second connection terminal 16.

The component member 300 shown in FIG. 11 corresponds to a cross-section taken along a line XI-XI in FIG. 10. The component member 300 shown in FIG. 12 corresponds to a cross-section taken along a line XII-XII in FIG. 10.

Further, in the present embodiment, the first mold part 410 is brought into contact with the portion of the internal terminal 15a to be exposed from the opening portion 193 via a cushioning material 430. In other words, the cushioning material 430 is arranged between the portion of the internal terminal 15a to be exposed from the opening portion 193 and the first mold part 410. Therefore, it is possible to suppress damage to the portion of the internal terminal 15a to be exposed from the opening portion 193. The cushioning material 430 is made of a material softer than the mold 400, such as fluorine resin, fluorine rubber, or silicone rubber.

Next, although not shown, molten resin is injected into the mold 400 and solidified, so the resin molded part 19 having the opening portion 193 is formed. In this case, the internal terminal 15a and the second connection terminal 16 are individually fixed by the mold 400, in the present embodiment. Therefore, it is possible to suppress variation in the distance between the internal terminal 15a and the second connection terminal 16, and thus to suppress variation in inductance.

Subsequently, as shown in FIG. 13, the tie bars 210 connecting the control terminals 14 and the internal terminals 15a are cut. As a result, the tie bar remaining portions 15c that connect to the internal terminal 15a and project from the first and second protrusion side surfaces 191d and 191e of the protrusion 191 are provided. Thereafter, although not shown, the external terminal 15b is connected to the internal terminal 15a, and the control terminals 14 are bent. In this way, the semiconductor module 6 described above is produced.

The semiconductor module 6 of the present embodiment described above has the tie bar remaining portions 15c that connect to the internal terminal 15a and project from the resin molded part 19. Therefore, when forming the resin molded part 19, the second connection terminal 16 can be held between the first mold part 410 and the second mold part 420, as well as the tie bars 210, which will become the tie bar remaining portions 15c, can be held between the first mold part 410 and the second mold part 420. Accordingly, it is possible to suppress a change in the distance between the internal terminal 15a of the first connection terminal 15 and the second connection terminal 16. As a result, it is less likely that the insulating property between the internal terminal 15a and the second connection terminal 16 will be reduced due to the distance between the internal terminal 15a and the second connection terminal 16 being excessively reduced. Also, it is less likely that the inductance will increase due to the distance between the internal terminal 15a and the second connection terminal 16 being excessively increased.

(1) In the present embodiment, the control terminals 14, the internal terminal 15a and the tie bar remaining portions 15c are arranged on the same plane. Therefore, the semiconductor module 6 can be produced by preparing the terminal constituent member 200 in which the control terminal 14, the internal terminal 15a and the tie bar remaining portions 15c are integrated with one another. Accordingly, the manufacturing process can be simplified.

Second Embodiment

The following describes a second embodiment. In the present embodiment, dimensions of the protrusion 191 are defined, as compared with the first embodiment. The other configurations of the present embodiment are similar to those of the first embodiment, and therefore a description of the similar configurations will not be repeated.

Figure 14:
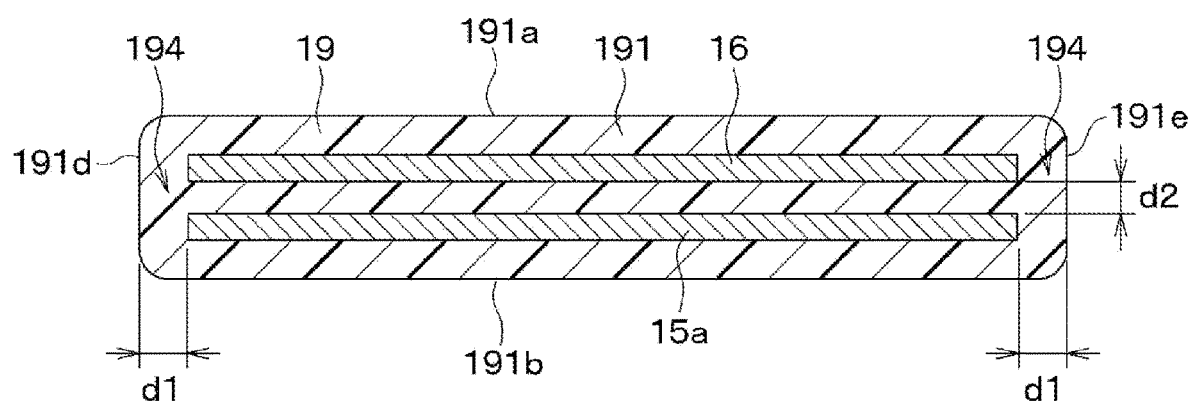
FIG. 14 is a diagram showing a cross-sectional view of a semiconductor module according to a second embodiment.

The semiconductor module 6 of the present embodiment has a basic configuration similar to that of the first embodiment. In the present embodiment, on the other hand, the thickness of the protrusion 191 of the resin molded part 19 is defined. As shown in FIG. 14, in the resin molded part 19, the distance between the first connection terminal 15 (that is, the internal terminal 15a) and second connection terminal 16 and the first protrusion side surface 191d or the second protrusion side surface 191e is referred to as a distance d1. The distance between the first connection terminal 15 (that is, the internal terminal 15a) and the second connection terminal 16 is referred to as a distance d2.

The distance d1 can be regarded as a thickness of a side wall portion 194 of the resin molded part 19, the side wall portion 194 being located between the internal terminal 15a and second connection terminal 16 and the first protrusion side surface 191d or second protrusion side surface 191e. The first and second protrusion side surfaces 191d and 191e are surfaces of the protrusion 191 extending in the overlapping direction of the internal terminal 15a and the second connection terminal 16. The overlapping direction corresponding to the thickness direction of the internal terminal 15a or the second connection terminal 16. FIG. 14 shows a cross-sectional view taken along a line XIV-XIV in FIG. 3.

In the present embodiment, the ratio of the distance d1 to the distance d2, that is, the distance ratio d1/d2 is set to 1.0 or more and 2.5 or less. The distance d2 is set to 0.2 mm or more and 0.5 mm or less.

Next, a method for manufacturing the semiconductor module 6 will be described.

The semiconductor module 6 of the present embodiment is manufactured by placing the component member 300 in the mold 400 and then injecting the molten resin into the mold 400 in the similar manner to the first embodiment. In this case, the placement position of the component member 300 is adjusted so that the distance ratio d1/d2 is 1.0 or more and 2.5 or less. In addition, the placement position of the component member 300 is also adjusted so that the second distance d2 is 0.2 mm or more and 0.5 mm or less. The distance ratio d1/d2 and the distance d2 will be described hereinafter.

Figures 15, 16:
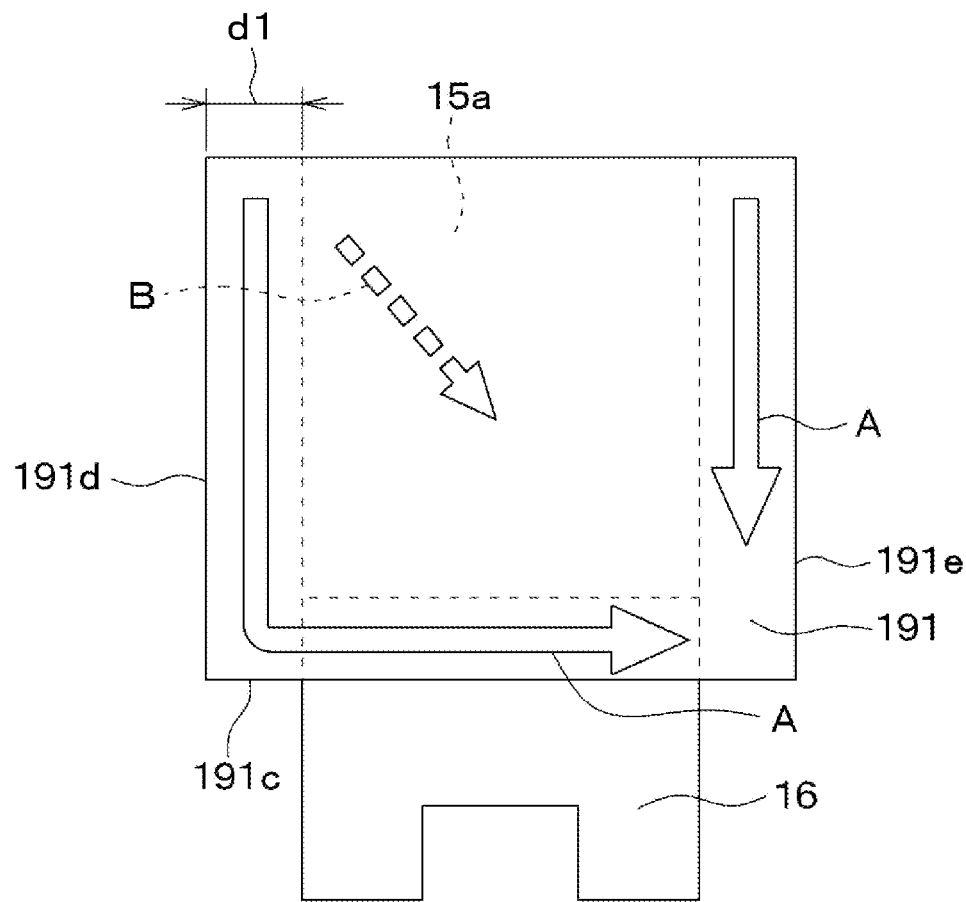
FIG. 15 is a diagram showing a flow of resin in a process of forming a resin molded part.
FIG. 16 is a diagram showing a relationship between a distance ratio and involved voids.

First, as shown in FIG. 15, when forming the protrusion 191 of the resin molded part 19, the molten resin flows into an area where the side wall portion 194 is to be formed as shown by an arrow A, as well as flows into a space between the internal terminal 15a and the second connection terminal 16 as shown by an arrow B. In this case, the flow velocity of the molten resin is proportional to the thickness of the flow passage, and increases as the thickness increases. That is, the flow velocity of the molten resin in the area where the side wall portion 194 is to be formed increases as the distance d1 increases.

For this reason, if the distance ratio d1/d2 is excessively large, the flow velocity of the molten resin in the area where the side wall portion 194 is formed is excessively increased, so the molten resin flows into the space between the first connection terminal 15 (that is, the internal terminal 15a) and the second connection terminal 16 while involving voids. If the voids are formed in the portion of the resin molded part 19 between the first connection terminal 15 and the second connection terminal 16, the insulation property between the first connection terminal 15 and the second connection terminal 16 degrades. According to the studies of the inventors of the present disclosure, as shown in FIG. 16, it was confirmed that entrapment or involvement of voids does not occur when the distance ratio d1/d2 is 2.5 or less, but does occur when the distance ratio d1/d2 is 2.7 or more. In the present embodiment, therefore, the distance ratio d1/d2 is set to 2.5 or less.

Further, in the semiconductor module 6 as described above, according to the studies of the inventors of the present disclosure, it was confirmed that the distance d1 is preferably equal to or larger than the distance d2 for the impact resistance of the side wall portion 194 against an external force. In the present embodiment, therefore, the distance ratio d1/d2 is set to 1.0 or more and 2.5 or less.

In addition, the first connection terminal 15 (that is, the internal terminal 15a) and the second connection terminal 16 are arranged to overlap each other in order to reduce the inductance. In this case, the inductance can be reduced with the reduction of the distance d2. However, if manufacture variation occurs, the insulation property is likely to degrade. For this reason, the inventors of the present disclosure investigated the distance d2. The inventors of the present disclosure found that if the distance d2 is 0.2 mm or more and 0.5 mm or less, the inductance is sufficiently reduced, and the insulation property is less likely to degrade even if manufacture variation occurs. Therefore, the distance d2 is set to 0.2 mm or more and 0.5 mm or less.

According to the present embodiment described above, since the first connection terminal 15 has the tie bar remaining portions 15c projecting from the resin molded part 19, the similar effects to those of the first embodiment can be achieved.

(1) In the present embodiment, the distance ratio d1/d2 is 1.0 or more and 2.5 or less. Therefore, it is possible to suppress the impact resistance from being excessively reduced while suppressing the occurrence of entrapment voids.

(2) In the present embodiment, the distance d2 is 0.2 mm or more and 0.5 mm or less. Therefore, it is possible to suppress the degradation of the insulation property while reducing the inductance between the first connection terminal 15 and the second connection terminal 16.

Third Embodiment

The following describes a third embodiment. In the present embodiment, the dimensions of the protrusion 191 are defined relative to the second embodiment. The other configurations of the present embodiment are similar to those of the second embodiment, and therefore a description of the similar configurations will not be repeated.

Figure 17:
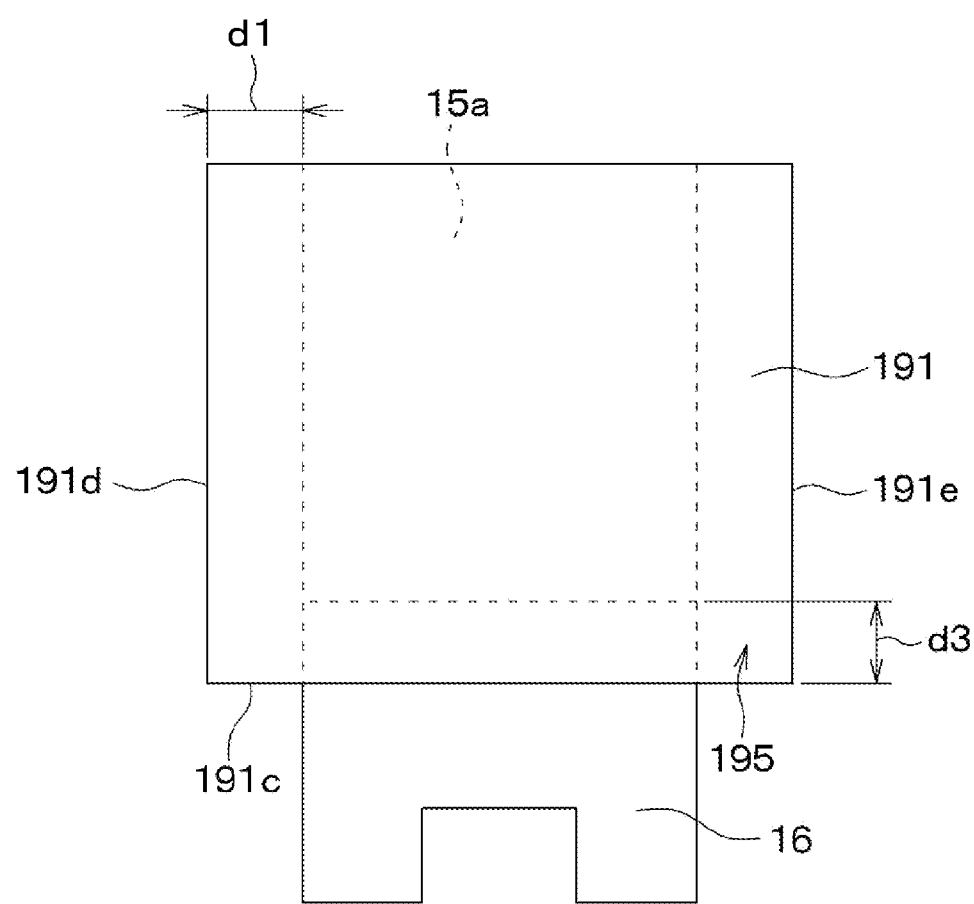
FIG. 17 is a diagram showing a plan view of a semiconductor module according to a third embodiment.

The semiconductor module 6 of the present embodiment has a basic configuration similar to that of the first embodiment. In the present embodiment, as shown in FIG. 17, the distance between the internal terminal 15a and the tip surface 191c of the protrusion 191 is referred to as a distance d3. Note that the distance d3 can also be regarded as the thickness of a tip portion 195 of the protrusion 191, the tip portion 195 being disposed between the end of the internal terminal 15a and the tip surface 191c of the protrusion 191.

In the present embodiment, similarly to the second embodiment, the ratio of the distance d3 to the distance d2, that is, the distance ratio d3/d2 is set to 1.0 or more and 2.5 or less.

According to the present embodiment described above, since the first connection terminal 15 has the tie bar remaining portions 15c projecting from the resin molded part 19, the similar effects to those of the first embodiment can be achieved.

(1) In the present embodiment, the distance ratio d3/d2 is 1.0 or more and 2.5 or less. For this reason, similarly to the second embodiment, it is possible to suppress the impact resistance from being excessively reduced while suppressing the occurrence of entrapment voids.

Other Embodiments

Although the present disclosure has been described in accordance with the embodiments, it is understood that the present disclosure is not limited to such embodiments or structures. The present disclosure encompasses various modifications and variations within the scope of equivalents. In addition, various combinations, and configurations, as well as other combinations and configurations that include only one element, more, or less, are within the scope and spirit of the present disclosure.

For example, the semiconductor module 6 of each of the embodiments described above may be applied to constitute circuits other than the three-phase inverter circuit. Also, the number of semiconductor chips 10 sealed in the resin molded part 19 can be changed as appropriate.

In each of the embodiments described above, connections of the semiconductor chips 101 to 106 and the first and second connection terminals 15 and 16 can be changed appropriately as long as those are arranged to overlap within the resin molded part 19.

In each of the embodiments described above, the resin molded part 19 may not be provided with the protrusion 191. For example, the semiconductor module 6 may be configured such that the second connection terminals 16 project from the third side surface 19e of the resin molded part 19 and the internal terminals 15a are exposed from the second surface 19b of the resin molded part 19.

In each of the embodiments described above, the control terminal 14 may not be arranged on the same plane as the internal terminal 15a.

The embodiments described above may be combined. For example, the second embodiment may be combined with the third embodiment, so that both the distance ratio d3/d2 and the distance ratio 3d/d2 are 1.0 or more and 2.5 or less.

What is claimed is:

1. A semiconductor module comprising:
    a semiconductor chip;
    a resin molded part that seals the semiconductor chip;
    a first connection terminal that is electrically connected to the semiconductor chip;
    a second connection terminal that is electrically connected to the semiconductor chip; and
    a control terminal that is electrically connected to the semiconductor chip, wherein
    the resin molded part has a predetermined surface, and an opening portion on a surface different from the predetermined surface,
    the first connection terminal and the second connection terminal each have a plate shape,
    the second connection terminal extends in a first direction in the resin molded part and projects from the predetermined surface of the resin molded part,
    the first connection terminal includes an internal terminal and an external terminal,
    the internal terminal is disposed in the resin molded part to extend along the first direction and overlap with the second connection terminal with a predetermined space therebetween in a second direction, and is exposed from the opening portion,
    the external terminal is connected to the internal terminal at the opening portion and projects outside the resin molded part, and
    the first connection terminal includes a tie bar remaining portion extending from the internal terminal in a direction that intersects the second direction and the first direction.

2. The semiconductor module according to claim 1, wherein
    the internal terminal and the tie bar remaining portion are disposed on a same plane as the control terminal.

3. The semiconductor module according to claim 1, wherein
    a distance between the internal terminal or the second connection terminal and a side surface of the resin molded part that extends in the second direction is referred to as a first distance,
    a distance between the internal terminal and the second connection terminal in the second direction is referred to as a second distance, and
    a ratio of the first distance to the second distance is 1.0 or more and 2.5 or less.

4. The semiconductor module according to claim 1, wherein
    a distance between the internal terminal and the predetermined surface of the resin molded part is referred to as a first distance,
    a distance between the internal terminal and the second connection terminal in the second direction is referred to as a second distance, and
    a ratio of the first distance to the second distance is 1.0 or more and 2.5 or less.

5. The semiconductor module according to claim 1, wherein
    a distance between the internal terminal and the second connection terminal in the second direction is 0.2 mm or more and 0.5 mm or less.

6. A method for manufacturing a semiconductor module, the semiconductor module including:
    a semiconductor chip;
    a resin molded part that seals the semiconductor chip;
    a first connection terminal that is electrically connected to the semiconductor chip;
    a second connection terminal that is electrically connected to the semiconductor chip; and
    a control terminal that is electrically connected to the semiconductor chip, wherein
    the resin molded part has a predetermined surface, and an opening portion on a surface different from the predetermined surface,
    the first connection terminal and the second connection terminal each have a plate shape,
    the second connection terminal extends in a first direction in the resin molded part and projects from the predetermined surface of the resin molded part,
    the first connection terminal includes an internal terminal and an external terminal,
    the internal terminal is disposed in the resin molded part to extend along the first direction and overlap with the second connection terminal with a predetermined space therebetween in a second direction, and is exposed from the opening portion,
    the external terminal is connected to the internal terminal at the opening portion and projects outside the resin molded part, and
    the first connection terminal includes a tie bar remaining portion extending from the internal terminal in a direction that intersects the second direction and the first direction,
    the method for manufacturing the semiconductor module, comprising:
    preparing a terminal constituent member in which the internal terminal and the control terminal are integrated through a tie bar;
    forming a component member by electrically connecting the second connection terminal to the semiconductor chip so that the second connection terminal are arranged to overlap with the internal terminal and by electrically connecting the internal terminal and the control terminal to the semiconductor chip;

placing the component member in a cavity of a mold, the mold including a first mold part and a second mold part, the cavity being provided by engaging the first mold part and the second mold part with each other;

forming the resin molded part by injecting a molten resin to the mold and solidifying the molten resin; and cutting the tie bar so that the tie bar remaining portion extending from the internal terminal and projecting from the resin molded part is provided, wherein in the placing of the component member, the component member is placed so that the second connection terminal is held between the first mold part and the second mold part, and the tie bar is held between the first mold part and the second mold part.

* * * * *